United States Patent [19]

Wang et al.

[11] Patent Number: 4,640,756
[45] Date of Patent: Feb. 3, 1987

[54] METHOD OF MAKING A PIEZOELECTRIC SHEAR WAVE RESONATOR

[75] Inventors: Jin S. Wang, Harbor City, Calif.; Kenneth M. Lakin; Allen R. Landin, both of Ames, Iowa

[73] Assignee: The United States of America as represented by the United States Department of Energy, Washington, D.C.

[21] Appl. No.: 736,164

[22] Filed: May 20, 1985

Related U.S. Application Data

[63] Continuation-in-part of Ser. No. 545,411, Oct. 25, 1983, abandoned.

[51] Int. Cl.$^4$ ............................................. C23C 14/38
[52] U.S. Cl. .............................................. 204/192.18
204/192 C
[58] Field of Search ....... 204/192 C, 192 SP, 192 PE, 204/192 R

[56] References Cited

U.S. PATENT DOCUMENTS

| | | |
|---|---|---|
| 3,486,046 | 12/1969 | Zalar . |
| 3,558,351 | 1/1971 | Foster . |
| 3,573,960 | 4/1971 | Duncan . |
| 3,766,041 | 10/1973 | Wasa et al. . |
| 3,846,649 | 11/1974 | Lehmann et al. . |
| 4,142,124 | 2/1979 | Ogawa et al. . |
| 4,164,676 | 8/1979 | Nishiyama et al. . |
| 4,229,506 | 10/1980 | Nishiyama et al. . |
| 4,297,189 | 10/1981 | Smith et al. . |

OTHER PUBLICATIONS

"UHF Composite Bulk Wave Resonators", Lakin et al, 1980 IEEE Ultrasonics Symposium, p. 834.
"Acoustic Bulk Wave Composite Reactors", Lakin et al, Appl. Phys. Lett., 38 (3), p. 125, 2/1/81.
"Low-Temperature Coefficient Bulk Acoustic Wave Composite Resonators", Wang et al., Appl. Phys. Lett., 40 (4), p. 308, 2/15/82.
"Aluminum Nitride Thin Film and Composite Bulk Wave Resonators", Lakin et al., 36th Annual Frequency Control Symposium, 1982.
"Cadmium Sulphide and Zinc Oxide Thin-Film Transducers", Foster et al., IEEE Transactions on Sonics and Ultrasonics, vol. SU-15, No. 1, p. 28.
"Variation of C-Axis Orientation of ZnO Thin Films Deposited by DC Diode Sputtering", Minikata et al., J. Appl. Phys., vol. 12, No. 3, p. 474.
"Highly Oriented ZnO Films by RF Sputtering of Hemispherical Electrode System", Ohji et al., J. App. Phys., vol. 47, No. 4, Apr., 1976.
"Sputtered C-Axis Inclined Piezoelectric Films and Shear Wave Resonators", Wang et al., 37th Annual Symposium on Frequency Control, 1983.
"Thin Film Resonators and Filters", Lakin et al., 1982 Ultrasonics Symposium.
"Sputtered C-Axis Inclined ZnO Films for Shear Wave Resonators", Wang et al., 1982 Ultrasonics Symposium.
"C-Axis Inclined ZnO Piezoelectric Shear Wave Films", Wang et al., App. Phys. Lett., 42 (4), 2/15/83.

Primary Examiner—John F. Niebling
Assistant Examiner—William T. Leader
Attorney, Agent, or Firm—James W. Weinberger; Arthur A. Churm; Judson R. Hightower

[57] ABSTRACT

An acoustic shear wave resonator comprising a piezoelectric film having its C-axis substantially inclined from the film normal such that the shear wave coupling coefficient significantly exceeds the longitudinal wave coupling coefficient, whereby the film is capable of shear wave resonance, and means for exciting said film to resonate. The film is prepared by deposition in a dc planar magnetron sputtering system to which a supplemental electric field is applied. The resonator structure may also include a semiconductor material having a positive temperature coefficient of resonance such that the resonator has a temperature coefficient of resonance approaching 0 ppm/°C.

13 Claims, 16 Drawing Figures

METHOD OF MAKING A PIEZOELECTRIC SHEAR WAVE RESONATOR

CONTRACTUAL ORIGIN OF THE INVENTION

The U.S. Government has rights in this invention pursuant to Contract No. W-7405-ENG-82 between the U.S. Department of Energy and Ames Laboratory.

This application is a continuation-in-part of U.S. patent application Ser. No. 545,411, filed Oct. 25, 1983, now abandoned.

BACKGROUND OF THE INVENTION

This invention relates to a method of making films of piezoelectric materials suitable for preparing piezoelectric acoustic shear wave resonators and a method for making said resonators.

Recent developments in electronics technology have resulted in dramatic size reductions in electronic systems, particularly those utilizing active semi-conductor devices. While many passive components have kept pace with this size reduction, mechanical resonators have not. The need for miniaturized resonators is particulalry acute in the area of very large scale analog integrated circuits associated with communications and signal processing Attempts at manufacturing suitable high-frequency resonators have concentrated on the use of piezoelectric resonator plates. However, piezoelectric plates for very high and microwave frequencies are not amenable to the conventional processing technology associated with quartz or other traditional resonator materials. For example, plates less than 10 $\mu$m thick are required in the VHF to microwave frequency range, but mechanical thinning of piezoelectric plates to the appropriate thickness is very difficult. In addition, for satisfactory resonance the plate surfaces must be parallel to a high precision.

It is known that resonators of suitable thinness and parallelism may be attained with piezoelectric films. These films may be manufactured by known means such as sputtering. Sputtered films of common piezoelectric materials show a strong tendency to grow with their C-axis perpendicular to the film substrate. These films are therefore suitable for longitudinal wave excitation when driven by an electric field perpendicular to the film plane.

For many applications it would be desirable to have a resonator suitable for excitation of shear waves rather than longitudinal waves. Shear wave excitation is possible when the C-axes of 6 mm piezoelectric crystallites lie in the substrate plane and the crystallites are aligned with one another. It is known that such films may be deposited on a substrate of zinc, $In_2O_3$ or $In_2O_3/SnO_2$, as described in U.S. Pat. No. 3,846,649 to Lehmann et al. disclosing a piezoelectric transducer. However, at the present time there is no satisfactory technique for growing C-axis inplane piezoelectric films for general application.

It has been calculated that, for piezoelectric materials of 6 mm symmetry such as ZnO, AlN and CdS, a nearly pure shear wave would be excited for films having C-axis orientation substantially inclined at an acute angle with respect to the surface normal such that the shear wave coupling coefficient significantly exceeds the longitudinal wave coupling coefficient, as reported by N. F. Foster, et al., IEEE Trans. on Sonics and Ultrasonics, Vol. SU-15, No. 1, Jan., 1968, p. 28. Under these conditions, the quasi-shear-wave excitation will greatly exceed the quasi-longitudinal-wave excitation, and hence a good shear wave acoustic device can be made. A C-axis angle of inclination of about 40° to about 50° is preferred. Foster et al. acknowledged that at the time of their writing such films could not be made. Ibid. at 40. Attempts have since been made to sputter deposit C-axis inclined ZnO film by placing the substrate at a 90° angle with respect to the target, as described by M. Minakata et al., Japan. J. Appl. Phys., Vol. 12, 1973, p. 474. However, the resulting films have uneven thickness and a mean C-axis variation unsuitable for device applications. In addition, it would be desirable for the response of the resonator to be relatively constant over a range of operating temperatures.

SUMMARY OF THE INVENTION

It is thus one object of the invention to provide a method of preparing thin films of piezoelectric material suitable for preparing a piezoelectric acoustic shear wave resonators.

It is yet another object of the invention to provide a piezoelectric acoustic shear wave resonator which has a response which is relatively constant over a range of operating temperatures.

It is still another object of the invention to provide a method of making a piezoelectric acoustic shear wave resonator.

Additional objects, advantages, and novel features of the invention will be set forth in part in the following description.

In accordance with the invention, a method is disclosed for preparing a piezoelectric film having its C-axis substantially inclined at an acute angle with respect to the film normal such that the shear wave coupling co-efficient of said film significantly exceeds the longitudinal wave coupling coefficient, whereby the film is capable of shear wave excitation. The film may be made sufficiently thin so that the excited shear waves are in the microwave region. The film is made of piezoelectric materials having 6 mm symmetry such as ZnO and AlN. The film is provided with electrodes on opposite sides to form an acoustic shear wave resonator.

The resonator of the instant invention is prepared by growing a film of a piezoelectric material on a substrate in a d.c. reactive sputtering system to which a supplementary electric field is applied from a control electrode near the substrate. The electric field has an orienting effect on the growing film, such that the angle of inclination of the C-axis of the film with respect to the substrate is a function of the voltage of the applied field, the distance of the electrode above the substrate and the lateral distance of the electrode from the substrate. After deposition the substrate may be etched away under a central portion of the film so that the film is supported by the substrate only at its periphery. Electrodes may be provided to both sides of the film by known means such as sputter deposition to form a shear wave resonator.

In another embodiment a layer of doped semiconductor material having a positive temperature coefficient of resonance may be incorporated into the resonator structure to compensate the temperature coefficient of resonance of the piezoelectric film such that the temperature coefficient of resonance of the composite structure approaches 0 ppm/°C. When this condition occurs, the resonance of the resonator is relatively constant over a range of operating temperatures.

DETAILED DESCRIPTION OF THE INVENTION

The following is a detailed description of a preferred embodiment of the instant invention; other embodiments will be readily apparent to those skilled in the art.

Figure 1A:
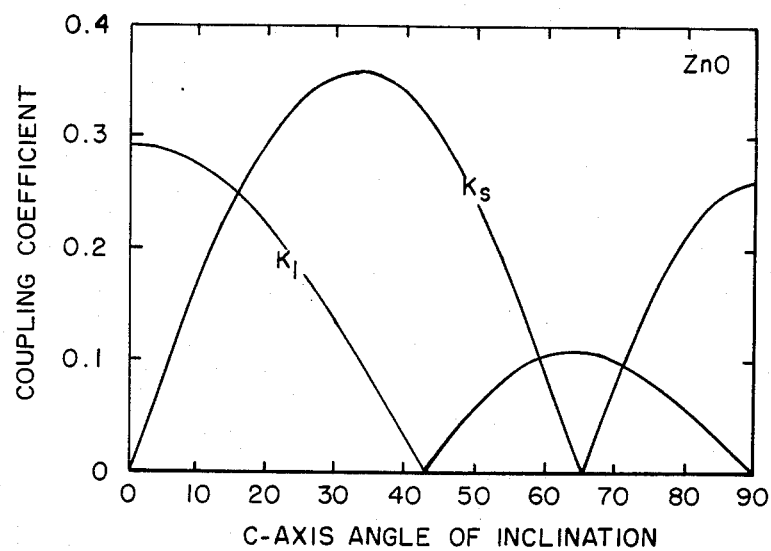
FIGS. 1A and 1B are graphs for ZnO and AlN, respectively, showing the shear wave coupling coefficient and longitudinal wave coupling coefficient as functions of the C-axis angle of inclination with respect to the film normal.
Figure 1B:
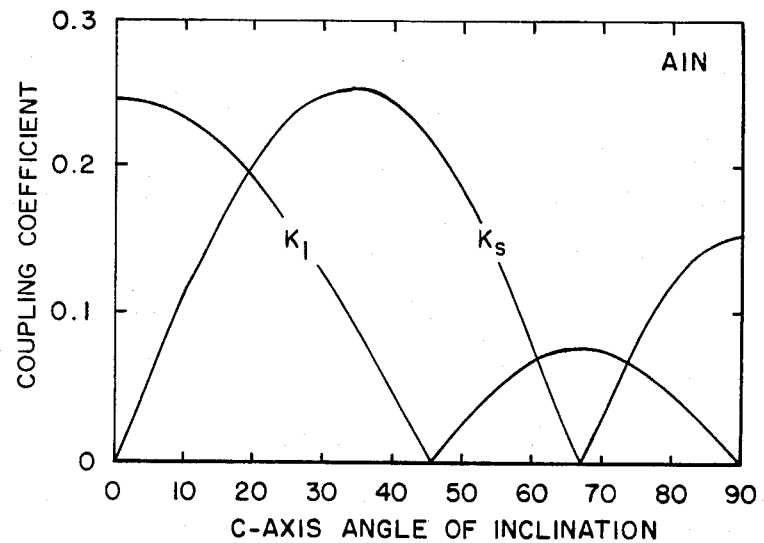

The instant invention is a method for depositing thin film piezoelectric material suitable for use as a piezoelectric acoustic shear wave resonator, and a method of making said resonator. The resonator comprises a piezoelectric electric film of a material having 6 mm symmetry. The C-axis of the film is substantially inclined at an acute angle with respect to the film normal, such that the shear wave coupling coefficient of said film significantly exceeds the longitudinal wave coupling coefficient of said film, whereby the film is capable of shear wave excitation. FIGS. 1A and 1B are graphs for ZnO and AlN, respectively, showing the shear wave coupling coefficient, $K_s$, and the longitudinal wave coupling coefficient, $K_1$, as functions of the C-axis angle of inclination from the film normal. As may be seen, the shear wave excitation is at a maximum for both materials when the C-axis angle of inclination is about 40°–50°.

Figure 2:
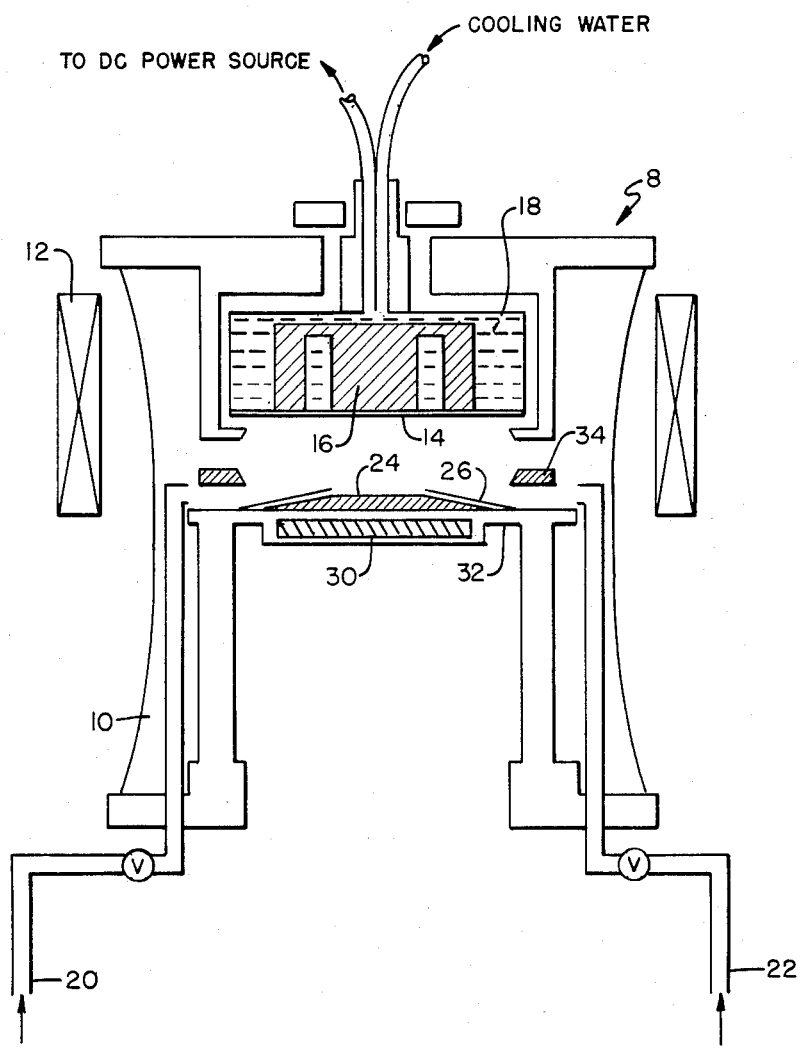
FIG. 2 illustrates a dc magnetron sputtering system adapted for use in the method of the instant invention.

By the method of the invention, the film is sputter deposited in a reactive sputtering system, such as the dc planar magnetron sputtering system illustrated in FIG. 2 or in a dc diode system. The reaction chamber 8 comprises bell jar 10 containing target 14 and magnet 16 which are cooled by coolant system 18. Gases are provided to reaction chamber 8 by means of inlets 20 and 22. Substrate 26 is positioned on substrate holder 24 parallel to target 14. Substrate holder 24 may be heated by means of heater 30 to a temperature monitored by thermocouple 32. Chamber 8 may be evacuated by conventional means such as a diffusion pump, not shown. As is known in the art, sputter deposition occurs when an electric field is applied to chamber 8 such that target 14 serves as a cathode and substrate 26 serves as an anode.

Unique to the method of the instant invention is the use of positively biased peripheral control electrode 34 to provide an additional dc electric field to chamber 8 during the sputter deposition process. The electrode typically may be a pheripheral ring as shown or it may be a bar-shaped electrode located centrally between the cathode and the anode. The electrode is positioned parallel to and above the plane of the substrate and laterally from directly above the substrate. The additional electrical field generated by control electrode 34 has the effect of forming a reversal field directly above the substrate which alters the direction of the ion flux as it strikes the substrate causing the film to grow with its crystallographic C-axis preferentially aligned and directed away from control electrode 34. The angle of inclination of the C-axis is a function of the voltage of the applied field, the distance of the electrode above the substrate and the lateral distance of the electrode from the substrate. For example the lateral reversal field distance is 1 to 2, preferably 1 times the distance of the electrode above the plane of the substrate. Thus an electrode positioned about 13 mm above the substrate will form a lateral reversal distance of about 25 mm. The electrode distance above the substrate may vary from 10 to about 15 mm with the sputtering device described. The electrode voltage may vary from about 30 to 50 volts as measured relative to the substrate. The method of the invention will produce substrates having a C-axis inclinations up to 45 degrees.

In addition, if the growing film is a dielectric, the anode collects electron current and thereby prevents arcing to the substrate during deposition.

Sputtered films for use in shear wave resonators which may be made by the method of the instant invention include piezoelectric materials of 6 mm symmetry such as ZnO and AlN.

EXAMPLE I

A target of 99.999% pure Zn, 5" in diameter, was sputtered in a reactive dc planar magnetron sputtering system of the type shown and described. A substrate of (100) Si was positioned about 5 cm from the target and heated to a temperature of about 300°C. In this example the substrate holder on which the substrate was positioned was substantially parallel to the target. The sputter deposition took place in an atmosphere of 99.999% pure oxygen at a pressure of 0.5–5 millitorr. The target cathode was at a voltage of about −300 volts dc and operated at a current of about 300 milliamperes. The peripheral anode voltage was about 30 volts dc. All voltages were measured relative to the grounded substrate. Under these conditions a film of ZnO was deposited on the substrate at a rate of about 2.0 μm/hr. The C-axis of the ZnO film thickness was inclined about 25° from the film normal. It was observed that the initial few thousand angstroms of the film were also oriented with the C-axis inclined the same angle from normal, indicating that extremely thin films capable of microwave λ shear wave excitation can be made by the method of the instant invention.

EXAMPLE II

Figure 3:
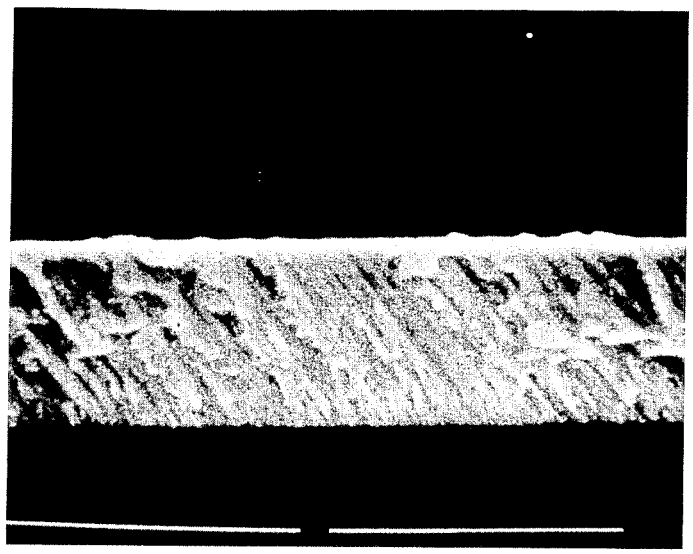
FIG. 3 is a scanning electron microscope photograph of a sputtered ZnO film with its C-axis inclined about 40° with respect to the film normal.

A ZnO film was sputter deposited as in Example I except that the substrate was tilted 15° to augment the angle of inclination of the C-axis. The C-axis of this film was tilted 40° from the film normal, as illustrated in FIG. 3. This film was clear, transparent and reproducible. The film thickness taper was 0.5% per millimeter and the variation of C-axis inclination angle was about 0.2° per millimeter as estimated from measurements made from the SEM photograph of FIG. 3. These measurements indicate that the film was suitable for use in resonators.

EXAMPLE III

Figure 4:
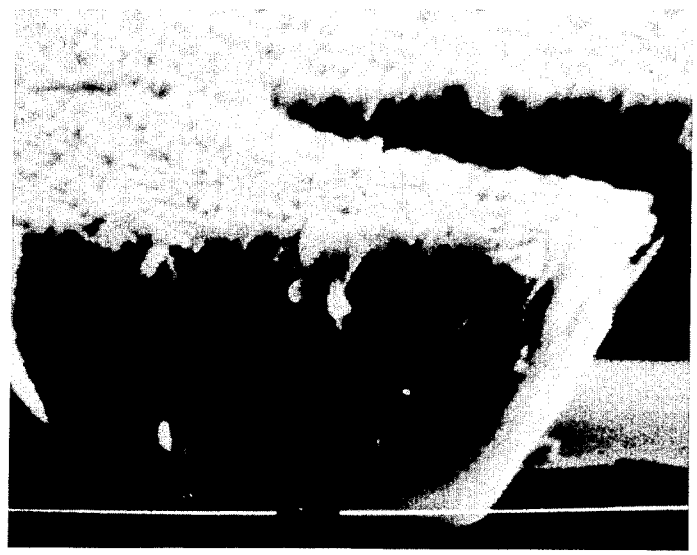
FIG. 4 is a scanning electron microscope photograph of a sputtered AlN film with its C-axis inclined about 30° with respect to the film normal.

An AlN film was deposited according to the general method used in Example I except that a 99.999% pure Al target and an atmosphere of 99.999% pure nitrogen were used. The substrate temperature was about 100°C. and the cathode current was about 800 milliamperes. The AlN film grew at a rate of about 1.5 μm/hr. When a dc anode voltage of about 30 volts was applied, the film grew with its C-axis tilted at about 30°, as shown in FIG. 4. This angle could be augmented by having the substrate tilted during deposition as described in Example II.

EXAMPLE IV

A target of 99.999% pure Zn, 5" in diameter, was sputtered in a reactive dc planar magnetron sputtering system as described previously. A substrate of Si was positioned parallel to and about 5 from the target and heated to a temperature of about 300° C. Sputter deposition took place in an atmosphere of 99.999% pure oxygen at a pressure of 3millitorr. The target cathode was at a voltage of about −550 volts dc at a current of 350 milliamperes. The peripheral electrode was positioned 13 millimeters above the plane of the substrate and the substrate was positioned just inside of the inner periphery of the electrode since the film will not grow in the shadow of the electrode. The electrode voltage was 35 volts dc, relative to ground. The C-axis of the film was inclined to 45 degrees from the film normal.

The foregoing examples are intended for illustration and are not intended to limit the sputter deposition parameters contemplated as being within the scope of the present invention. For example, the control electrode voltage is generally maintained anywhere between about 20 volts to about 40 volts to promote plasma stability and to obtain better film quality, but the voltage may be lower or higher than this range in order to obtain a lesser or greater angle of inclination of the C-axis. Other parameters such as target-substrate spacing, substrate temperature and cathode current may be varied as is known in the art of dc magnetron sputtering. In addition, the substrate may be tilted or not depending on the C-axis angle of inclination desired. In some cases tilting the substrate may cause undesirable variations in film thickness.

The substrate may comprise, for example, silicon, GaAs, or a combination of silicon and GaAs. In addition, the substrate may be provided with a deposition layer such as thermally grown oxide, a deposited metal film, or doped p+ silicon on which the piezoelectric film is deposited. The orientation of the C-axis of the deposited piezoelectric film appears to be independent of the substrate material and the material of the deposition layer.

The resonator of the instant invention comprises a film of piezoelectric material having its C-axis substantially inclined at an acute angle with respect to the film normal and at least two electrodes in proximity thereto to provide a means of excitation.

Figure 5:
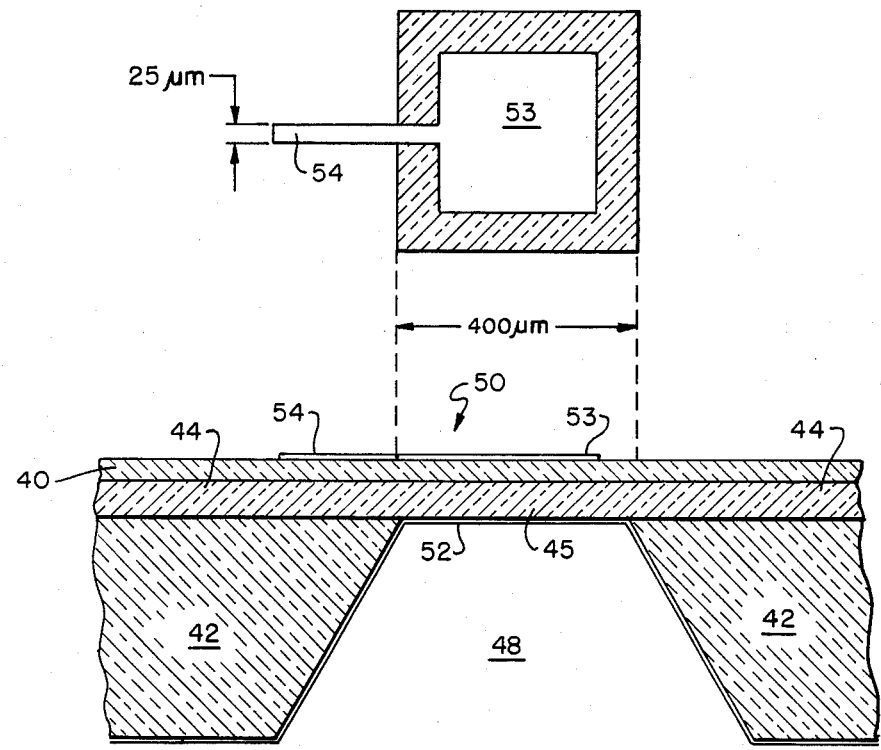
FIGS. 5A and 5B are a plan view and a cross-sectional elevational view, respectively, of a resonator embodying the instant inventive concept.

A resonator of the instant invention is illustrated in FIGS. 5A and 5B. In the illustrated embodiment a substrate 42 is provided with a deposition layer 44. A film of piezoelectric material 40 is sputter deposited by the method of the instant invention onto deposition layer 44. It may be seen that in the absence of deposition layer 44, film 40 may be sputter deposited directly onto substrate 42.

A generally pyramidal cavity 48 is selectively cut into the back side of substrate 42 by known means such as etching. FIG. 5B illustrates an embodiment wherein selective etching was used such that layer 44 remained essentially intact, whereby the portion of layer 44 spanning cavity 48 forms a membrane 45. The resulting structure is referred to as a composite. In embodiments in which layer 44 is an electrically conductive material such as a metal film or doped p+ silicon, membrane 45 may serve as an electrode. Alternatively, that portion of layer 44 may also be selectively etched away leaving only a piezoelectric plate spanning cavity 48.

A conductive layer 50 is provided on piezoelectric film 40. For example, conductive layer 50 may be doped p+ silicon or it may be deposited aluminum. The deposition may be done through an aperture as is known in the art so that conductive layer 50 is deposited in the form of an electrode having pad 53 and lead 54. Alternatively, conductive layer 50 may be deposited over a larger area of film 40 and an electrode may be photolithographically defined therefrom. In either case, electrode pad 53 is opposite cavity 48. A conductive layer 52 may be provided on the back side of the resonator structure to serve as a second electrode. Conductive layer 52 is opposite electrode pad 53 and may also extend over the back side of substrate 42. In embodiments in which the resonator is a composite resonator and membrane 45 is electrically conductive, conductive layer 52 may be omitted. In yet another embodiment, conductive layer 52 may be deposited prior to the deposition of piezoelectric film 40 such that conductive layer 52 is between deposition layer 44 and piezoelectric material 40.

Resonators can be characterized in terms of impedance and reasonator Q. The impedance Z is determined from the equation $$Z = 50 \frac{1 + \rho}{1 - \rho}$$

where $\rho$ is the reflection coefficient measured as a function of frequency. The resonator Q is a measure of the ratio of energy stored to energy lost and is determined from the computed phase of Z, $A_\phi$, such that $$Q = \frac{f_r}{2} \frac{dZ_\phi}{df} \bigg|_{f_r}$$

where $f_r$ is the resonant frequency. This definition of Q follows directly from parallel or series RLC circuits. because impedance is a property of the resonator alone and is not determined by the external circuit, Q determined in this manner is the unloaded or device Q.

EXAMPLE V

Figure 6:
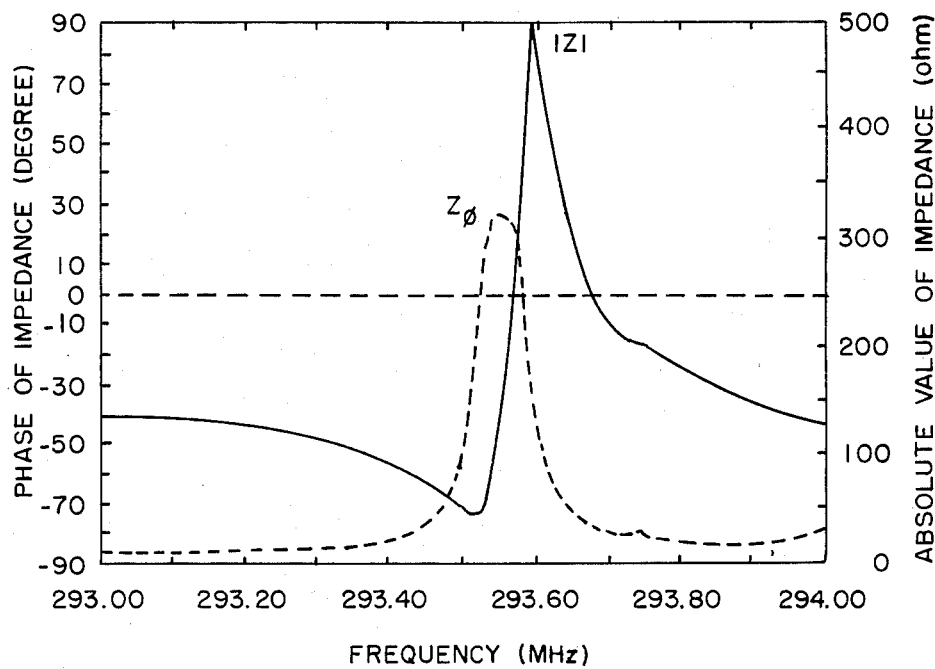
FIG. 6 is an impedance plot for the resonator of Example IV.

A composite resonator was prepared as described above comprising 2.8 μm ZnO with its C-axis inclined 40° from the film normal on 5 μm Si having a deposition layer of p+ silicon membrane. The resonator was provided with aluminum electrodes. The resonator was characterized as having series Q of 4600, parallel Q of 3800, 40Ω series resistance including 10 for metalization, and 495Ω parallel resistance. The shear wave resonant responses were detected at fundamental frequencies of 293.55 MHz for series resonance and 293.66 MHz for parallel resonance. No longitudinal resonant responses were detected. FIG. 6 shows the phase and absolute value of impedance of the resonator as a function of frequency around fundamental resonance frequencies. The temperature coefficient of resonance was determined by placing the resonator at the end of a coaxial cable in an environmental chamber and measuring the series and parallel resonant frequencies as a function of temperature. The temperature coefficient of resonance was found to be −20.5 ppm/° C. around room temperature.

EXAMPLE VI

Figure 7:
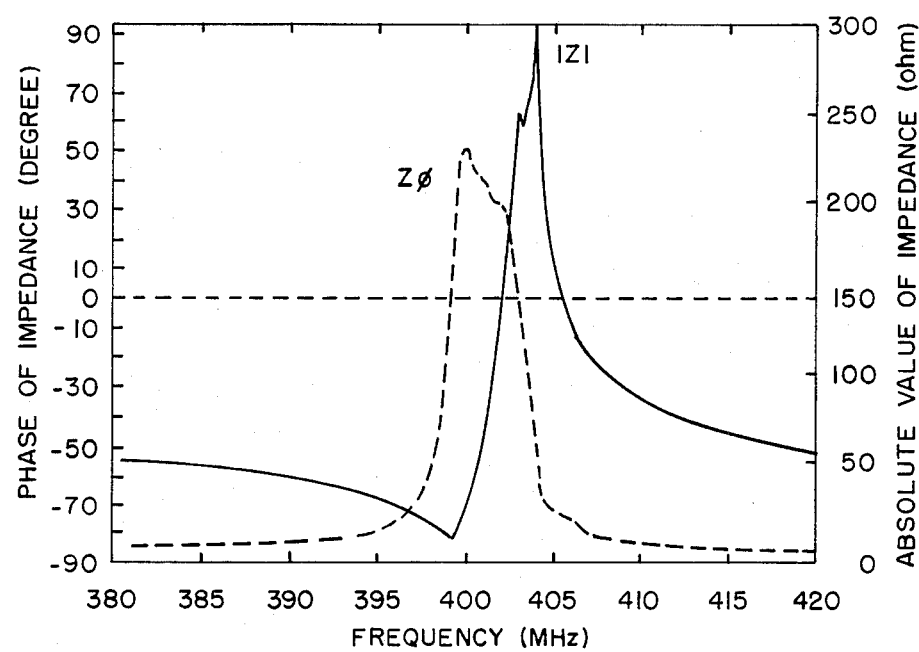
FIG. 7 is an impedance plot for the resonator of Example V.

A resonator was prepared as described in Example V except that prior to deposition of the electrodes the p+ silicon membrane was removed from under the ZnO using $CF_4$ gas plasma etching, leaving a ZnO plate supported at its periphery. The ZnO plate is mechanically rugged and may be made as thin as 1 μm, although plate bowing was observered if the plate thickness was less than 3 μm. For a 3.5 μm ZnO plate having 2000 Å aluminum electrodes, the shear wave resonant responses were measured at fundamental frequencies of 398.96 MHz for series resonance and 403.60 MHz for parallel resonance which corresponds to a shear acoustic wave velocity of 2830 m/s. Using the series and parallel resonant frequencies an effective coupling coefficient of 17% ($k^2 = 9.029$) was calculated, which is lower than that calculated for single crystal ZnO (33%). This degradation was likely caused by nonuniformities in the film. The resonator Q was somewhat lower than expected due to a parasitic transducer effect existing at the overlap of an electrode onto the substrate p+ region. Typically, resonator Q is in the range of 1200–2500 for devices of the instant invention having transducer parasitic loss. The temperature coefficient of the ZnO plate resonator was found to be approximately −36.2 ppm/° C. around room temperature. FIG. 7 is an impedance plot for this ZnO plate resonator around the fundamental resonant frequencies.

EXAMPLE VII

Figure 8:
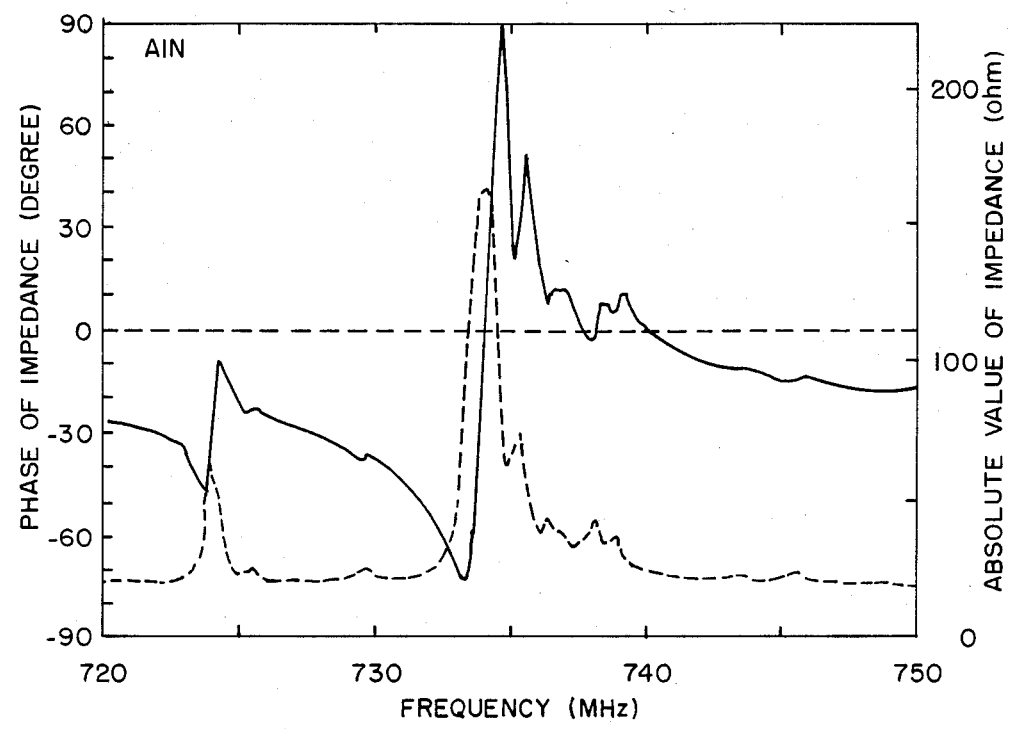
FIG. 8 is an impedance plot for the resonator of Example VI.

A 3.8 μm thick AlN plate resonator was prepared as generally described in Example VI. The AlN plate was even more rugged than the ZnO plate. The fundamental shear wave resonant response was measured at 734.45 MHz, corresponding to a shear acoustic wave velocity of 5585 m/s. As in Example VI, the resonator Q was lower than expected due to a parasitic transducer effect. The impedance plot for this resonator is shown in FIG. 8.

Figure 9A:
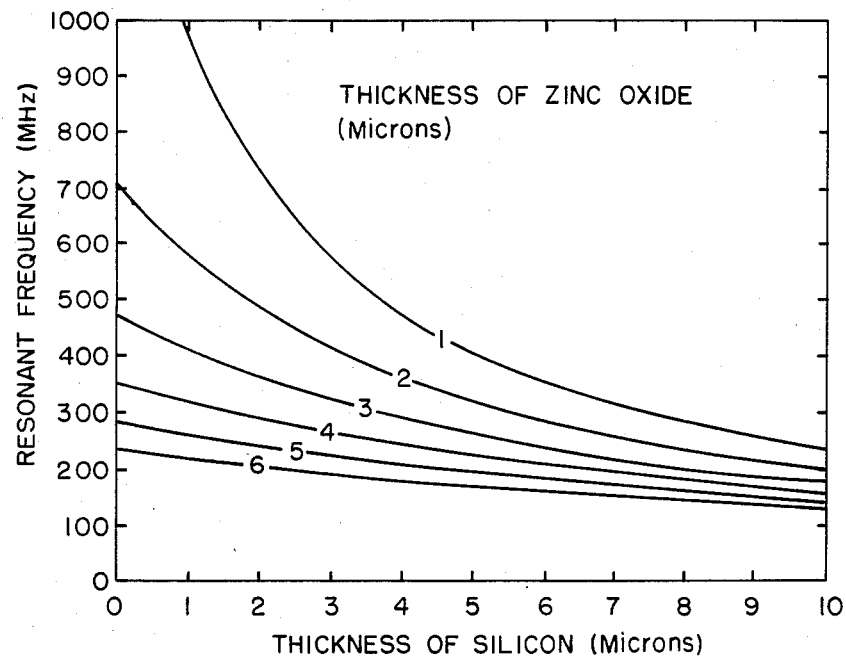
FIGS. 9A and 9B are plots of fundamental frequency as a function of film thickness for ZnO composite resonators and AlN composite resonators, respectively.
Figure 9B:
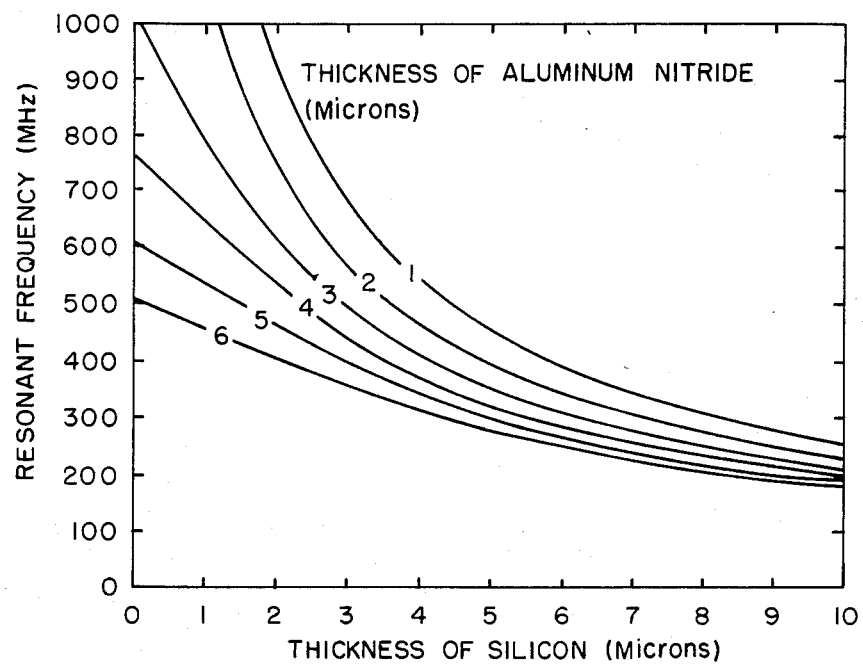

Generally resonator frequency is a function of the film thickness and the type of film material used. In a composite resonator, the membrane material and thickness is also a factor. FIGS. 9A and 9B show fundamental parallel resonant frequencies of composite resonators having a p+ silicon membrane as a function of p+ silicon membrane thickness for several values of ZnO or AlN thickness. ZnO composite resonators have fundamental resonant frequencies in the range of 200 MHz to 400 MHz, while the frequencies of AlN composite resonators range from 300 MHz to 500 MHz.

For many applications it would be desirable to have resonators whose response is relatively constant over a range of operating temperatures. Ideally, the resonators would have a temperature coefficient of resonance of 0 ppm/C°. A unique advantage of the instant invention is that shear wave resonators can be made which approach this condition.

Figure 10A:
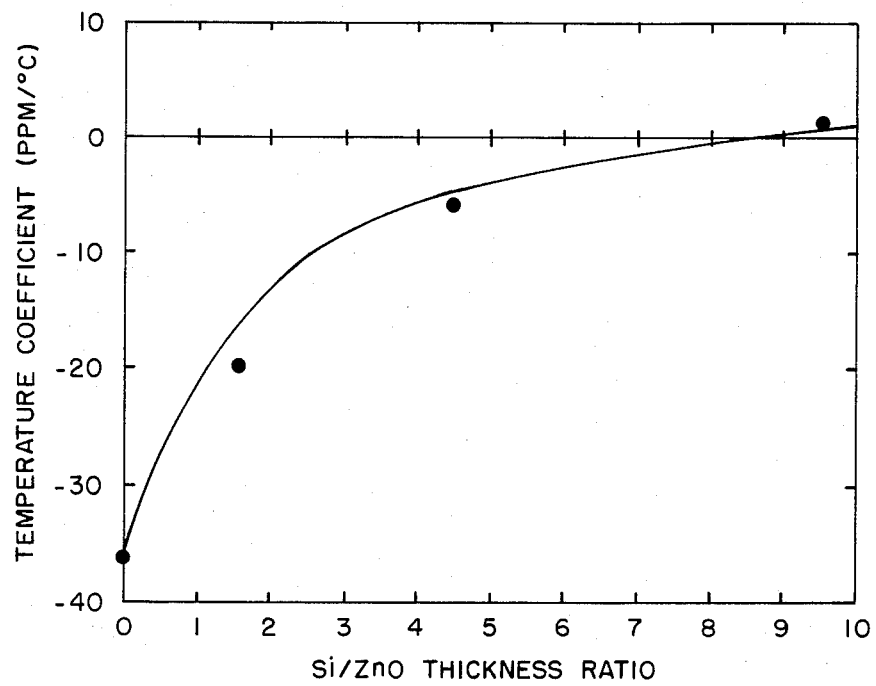
FIGS. 10A and 10B are plots, for composite resonators comprising piezoelectric material on p+Si membrane, of temperature coefficients of resonance as a function of the ratio of membrane thickness to film thickness for ZnO and AlN, respectively.
Figure 10B:
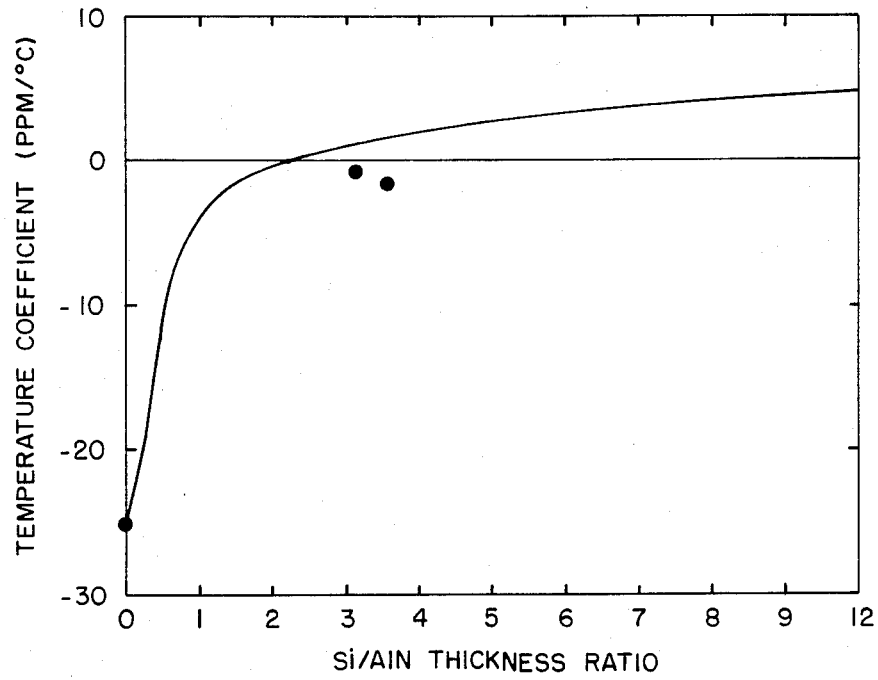

Based on the linear elastic theory, p+ Si membrane appears to have a positive temperature coefficient. We have found that ZnO and AlN films have a negative temperature coefficient and thereby can effectively compensate the p+ Si membrane to give an overall temperature coefficient near zero. The key parameter is the ratio of the thickness of the p+ silicon membrane to the thickness of the piezoelectric film. FIGS. 10A and 10B are plots of temperature coefficients as a function of these ratios for ZnO and AlN, respectively. The solid lines are the predictions of linear elastic theory, and the points are experimental data taken near room temperature by the general method described in Example V. The theoretical calculations are based on the assumption that the p+ Si may be considered as a homogeneously doped membrane with a temperature coefficient of +9 ppm/C° around room temperature. These graphs show that for the p+ Si/ZnO composite the temperature coefficient of resonance is about 0 ppm/° C. when the thickness ratio ranges from about 8:1 to about 10:1, and for the p+ Si/AlN composite the temperature coefficient of resonance is about 0 ppm/° C. when the thickness ratio ranges from about 1.5:1 to about 3.5:1.

Figure 11A:
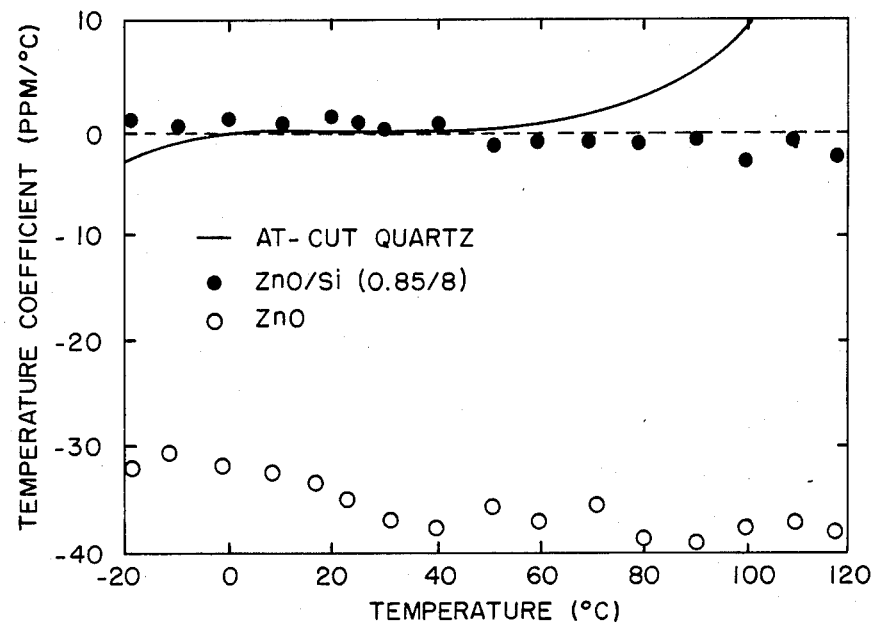
FIGS. 11A and 11B are graphs comparing temperature coefficient data of composite ZnO/Si and AlN/Si resonators, respectively with the corresponding data of ZnO and AlN plate resonators and AT-cut quartz.
Figure 11B:
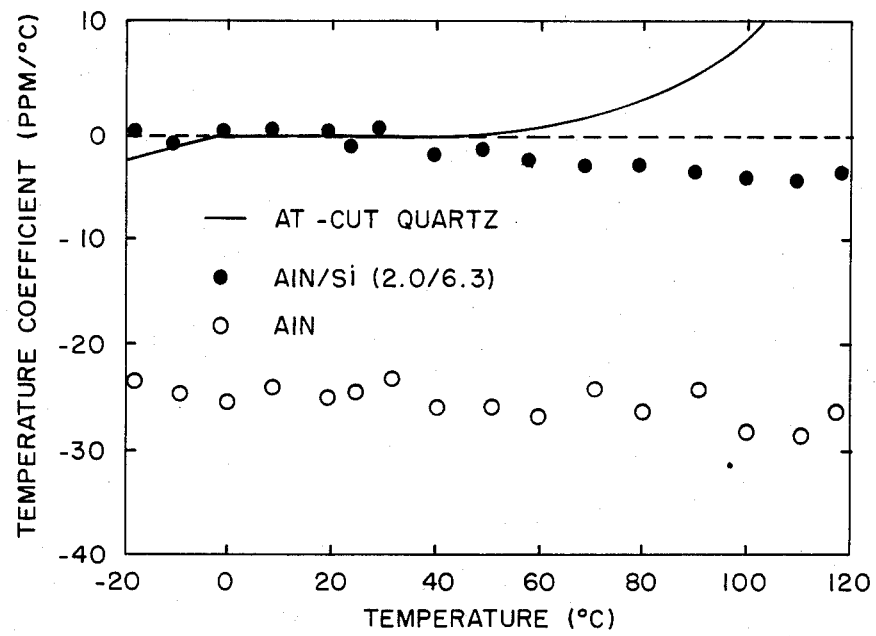

FIGS. 11A and 11B are graphs comparing temperature coefficient data of composite p+ Si/ZnO and p+ Si/AlN resonators, respectively, with the corresponding data of ZnO and AlN plate resonators and AT-cut quartz, a material commonly used in mechanical plate resonators. The ZnO composite resonator comprised 0.85 μm ZnO on 8 μm p+ Si, and the AlN resonator comprised 2.0 μm AlN on 6.3 μum p+ Si. It may be seen that the composite resonators of the instant invention have temperature coefficients better than AT-cut quartz.

The foregoing description of the preferred embodiment is not intended to limit the invention to the precise form disclosed. Many modifications and variations will be apparent to those skilled in the art in light of the above teaching. For example, other heavily doped semiconductor material exhibit a positive temperature coefficient of resonance, and optimum thickness ratios may be determined for these materials to obtain resonators having temperature coefficients of about 0 ppm/° C. Furthermore, those skilled in the art will understand that the resonator of the instant invention can be placed against an object to transmit acoustic waves therethrough, whereby the resonator would then operate as a transducer. The embodiment was chosen and described in order to best explain the principles of the invention and its practical application.

The embodiments of this invention in which an exclusive property or privilege is claimed are defined as follows:

1. A method of depositing a film of piezoelectric material on a substrate, the film having a uniform, controlled, inclined C-axis orientation comprising:
   providing a dc planar reactive sputtering system having a chamber containing a cathode for holding a target, an anode spaced from and parallel to the cathode for holding the substrate and a reactive gas,
   establishing an electrical field between the cathode and the anode to sputter the target such that the target material ionizes to form an ion flux which reacts with the reactive gas forming the piezoelectric material which deposits on the substrate,
   providing a positively biased control electrode in the chamber near the substrate and establishing a second, dc electrical field between the control electrode and the anode to collect the electron current and control the ion flux, the electrode position and the strength of the dc field being sufficient to alter the direction of the ion flux as it strikes the substrate to control the orientation of the C-axis away from the direction of the control electrode, the distance of the electrode above the plane of the substrate and the strength of the second electrical field controlling the degree of inclination of the C-axis, thereby forming a film of piezoelectric material having a uniform, controlled, inclined C-axis.

2. The method of claim 1 wherein the control electrode is positioned above the plane of the substrate and laterally from directly above the substrate.

3. The method of claim 2 wherein the voltage of the control electrode relative to the substrate is from 30 to 50 volts dc.

4. The method of claim 3 wherein the target is selected from the group consisting of zinc and aluminum.

5. The method of claim 4 wherein the reactive gas is selected from the group consisting of oxygen and nitrogen.

6. The method of claim 5 wherein the target is zinc, the reactive gas is oxygen and the substrate is heated to about 300° C.

7. The method of claim 5 wherein the target is aluminum, the reactive gas in nitrogen and the substrate is heated to about 100° C.

8. A method of forming a piezoelectric shear wave resonator comprising:
   providing a dc planar sputtering system having a chamber containing a cathode for holding a target, an anode spaced from and parallel to the cathode for holding a substrate and a reactive gas,
   establishing an electrical field between the cathode and the anode to sputter the target such that the target material ionizes to form an ion flux which reacts with the reactive gas forming the piezoelectric material which deposits on the substrate,
   providing a positively biased control electrode in the chamber near the substrate and establishing a second, dc electrical field between the control electrode and the anode to collect the electron current and control the ion flux, the electrode position and the strength of the dc field being sufficient to alter the direction of the ion flux as it strikes the substrate to control the orientation of the C-axis away from the direction of the control electrode, the distance of the electrode above the plane of the substrate and the strength of the second electrical field controlling the degree of inclination of the C-axis,
   removing the substrate under a portion of the deposited film to form a cavity such that the film forms a plate spanning the cavity, and
   depositing a layer of electrically conductive material on each side of the film to form upper and lower electrodes for applying a current to the film to excite the film, thereby forming the shear wave resonator.

9. The method of claim 8 including the additional step of first providing a deposition layer on the substrate, the piezoelectric material being deposited on the deposition layer, the substrate being removed under the deposition layer to form a cavity while the deposition layer remains essentially intact forming a composite of the film and deposition layer spanning the cavity, the lower electrode being deposited on the deposition layer.

10. The method of claim 9 including the step or removing a portion of the desposition layer adjacent the cavity to provide a plate of the film spanning the cavity, the lower electrode then being deposited on the film.

11. The method of claim 9 wherein the substrate is silicon and the deposition layer is $p^+$ silicon, and wherein the piezoelectric film is deposited such that the thickness of the deposition layer and the thickness of the piezoelectric film are in a predetermined ratio so that the temperature coefficients of resonance of the piezoelectric film and the deposition layer compensate one another, whereby the resonator has a temperature coefficient of resonance of about 0 ppm/C.

12. The method of claim 11 wherein the piezoelectric material is ZnO and the ratio is between 8:1 and about 10:1.

13. The method of claim 11 wherein the piezoelectric material is AlN and the ratio is between 1.5:1 and 3.5:1.

* * * * *